(12) United States Patent
Yamashita et al.

(10) Patent No.: US 7,377,992 B2
(45) Date of Patent: May 27, 2008

(54) METHOD AND APPARATUS FOR DETECTING END POINT

(75) Inventors: Takeshi Yamashita, Osaka (JP); Takao Yamaguchi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 273 days.

(21) Appl. No.: 11/340,540

(22) Filed: Jan. 27, 2006

(65) Prior Publication Data

US 2006/0189006 A1    Aug. 24, 2006

Related U.S. Application Data

(62) Division of application No. 10/858,402, filed on Jun. 2, 2004, now Pat. No. 7,026,173.

(30) Foreign Application Priority Data

Jun. 12, 2003   (JP)   .............................. 2003-168281

(51) Int. Cl.
*C23F 1/00* (2006.01)
(52) U.S. Cl. ..................... 156/345.25; 438/9; 216/60
(58) Field of Classification Search ........... 156/345.25, 156/345.24; 216/60
See application file for complete search history.

(56) References Cited

U.S. PATENT DOCUMENTS

| 4,208,240 A | * | 6/1980 | Latos ........................ 216/60 |
| 6,794,206 B2 | | 9/2004 | Hirose et al. |
| 2004/0040658 A1 | | 3/2004 | Usui et al. |

FOREIGN PATENT DOCUMENTS

| JP | 2001-85388 A | 3/2001 |
| JP | 2001-284323 A | 10/2001 |
| JP | 2002-129364 A | 5/2002 |

* cited by examiner

*Primary Examiner*—Richard A. Booth
(74) *Attorney, Agent, or Firm*—McDermott Will & Emery LLP

(57) ABSTRACT

A mask layer and a to-be-processed layer are irradiated with light to measure interference light formed of reflected lights from the mask layer and reflected lights from the to-be-processed layer. Thereafter, an interference component brought by the mask layer is removed from the waveform of the measured interference light, thereby calculating the waveform of the interference light brought by the to-be-processed layer. The thickness of the remaining to-be-processed layer is determined on the basis of the calculated waveform of the interference light and the thickness of the remaining to-be-processed layer is compared with a desired thickness thereof. In this way, an end point of processing on the to-be-processed layer is detected.

3 Claims, 13 Drawing Sheets

Interference Light on Mask Layer
(When phase difference $\gamma$ is not taken into account)

Interference Light on Mask Layer
(When phase difference $\gamma$ is not taken into account)

IEP (Interferometer End Point) Waveform for Wafer of Real Structure

Sine Wave

Linear Function with Negative Slope (Monotone Decreasing Line)

METHOD AND APPARATUS FOR DETECTING END POINT

CROSS-REFERENCE TO RELATED APPLICATIONS

This application is a divisional of Application Ser. No. 10/858,402, filed on Jun. 2, 2004, now U.S. Pat. No. 7,026,173, which in turn claims the benefit of Japanese Application No. 2003-168281, filed Jun. 12, 2003, the disclosures of which Applications are incorporated by reference herein.

BACKGROUND OF THE INVENTION (1) Field of the Invention

The present invention relates to end-point detection in a processing on a to-be-processed layer using plasma etching or the like.

(2) Description of Related Art

With the increasing miniaturization of semiconductor devices, gate oxide films have become thinner. As a result, dry etching of a polysilicon film that will be a gate electrode has required detection of an end point of etching before exposure of a gate oxide film. To meet the requirement, a method for detecting an end point using interference lights obtained by the interference of reflected lights, as disclosed for example in Japanese Unexamined Patent Publication No. 2001-85388, allows the end point of etching to be detected before exposure of a gate oxide film.

First, an etching device to which a known end-point detection method is applied will be described with reference to FIG. 10.

An etching device shown in FIG. 10 comprises a process chamber 10, a lower electrode 12 positioned on the bottom of the process chamber 10 and serving as a sample stage on which a semiconductor substrate 11 is to be put, and a top plate 13 placed above and located a predetermined distance apart from the lower electrode 12. A coil 14 is placed on the top plate 13. The process chamber 10 is provided with a gas supply part (not shown) and a gas-emitting part 15 to which an evacuator (not shown) is connected. RF power sources 16 are connected via matching boxes (not shown) to the lower electrode 12 and a coil 14, respectively. Power is applied from the RF power sources 16 to the lower electrode 12 and the coil 14, thereby etching the semiconductor substrate 11.

As further shown in FIG. 10, a window member 17 is mounted to the top plate 13, and a light-receiving/emitting device 19 is placed above the window member 17. The light-receiving/emitting device 19 irradiates the semiconductor substrate 11 with light from a light source 18 and collects lights reflected on the semiconductor substrate 11. The light source 18 is connected via an optical fiber 20 to the device 19, the device 19 is connected via an optical fiber 20 to a spectroscope 21, and the spectroscope 21 is in turn connected via an optical fiber 20 to an end-point detection apparatus 22, respectively. Furthermore, the end-point detection apparatus 22 is connected to a control section 23 of the etching device. When an end-point detection signal 24 is transmitted from the end-point detection apparatus 22 to the control section 23, the control section 23 transmits, to the RF power sources 16, signals 25 for stopping the application of power in order to complete etching.

Next, the known end-point detection method will be described with reference to FIGS. 10, 11A and 11B.

As shown in FIGS. 10 and 11A, light from a light source (light source 18) is radiated vertically to the surface of a Si substrate (semiconductor substrate 11). In this relation, a polysilicon film is formed above the Si substrate with a gate oxide film interposed therebetween. While part of the radiated light from the light source is reflected on the polysilicon film, another part of the radiated light transmits the polysilicon film and is then reflected on the interface between the gate oxide film and the polysilicon film. These reflected lights interfere with each other to form interference light. The interference light is recaptured through the window member 17 of the top plate 13, the device 19, the optical fiber 20, and the spectroscope 21 by the end-point detection apparatus 22. In this case, the waveform of the interference light (time variations in the intensity of the interference light) varies depending on the thickness of the remaining polysilicon film. Thus, the monitoring of the interference light waveform enables the detection of the instant at which the thickness of the remaining polysilicon film reaches a desired value, i.e., an end point of etching.

FIG. 11A shows the paths of radiated light beams from the light source and the paths of the reflected light beams from the polysilicon film and the like. In this figure, these paths are tilted for convenience.

A description will be given below of the relationship between the thickness d of the remaining polysilicon film and interference light during etching with reference to FIGS. 11A and 11B.

As shown in FIG. 11A, there is a path difference $2d$ between the reflected light from the polysilicon film and the reflected light from the interface between the gate oxide film and the polysilicon film. Therefore, when the light from the light source is radiated vertically to the substrate, this path difference $2d$ wholly constitutes a phase difference between the two reflected lights to produce interference light. Accordingly, as shown in FIG. 11B, when this phase difference is any integral multiple of the wavelength of the reflected light in the polysilicon film, the intensity of the interference light becomes strongest. On the other hand, when this phase difference is shifted a half wavelength from any integral multiple of the wavelength of the reflected light in the polysilicon film, the intensity of the interference light becomes weakest. More particularly, with the increase in etching amount, the intensity of the interference light periodically varies.

In this case, the relationship between the thickness d of the remaining polysilicon film and the interference light is represented by the following equations (1) through (3):

$$\text{Intensity of Interference Light} = A^2 + B^2 + 2AB \times \cos(a-b) \quad (1)$$

$$\text{Phase Difference } (a-b) = 2\pi n \times (2d/\lambda) \quad (2)$$

$$\text{Remaining Film Thickness } d = d_0 - Rt \quad (3)$$

wherein A and B represent the respective amplitudes of the reflected lights, a and b represent the respective initial phases of the reflected lights, n represents an integer, d represents the thickness of the remaining polysilicon film, $d_0$ represents the initial thickness of the polysilicon film, R represents the etching rate of the polysilicon film, t represents etching time, and $\lambda$ represents the wavelength of the light.

A description will be given below of a known method for fabricating a semiconductor device and more particularly of a known method for forming a gate electrode with reference to cross-sectional views showing process steps in FIGS. 12A through 12C.

First, as shown in FIG. 12A, a gate oxide film 33 is formed by thermal oxidation or the like on a semiconductor substrate 31 formed with an isolation region 32. Then, a polysilicon film 34 and a silicon oxide film 35 are successively formed thereon by a film forming method such as Chemical Vapor Deposition (CVD). Thereafter, a desired gate resist pattern 36 is formed thereon using photolithography.

Next, as shown in FIG. 12B, dry etching is performed on the silicon oxide film 35 by a dry etching technique using the gate resist pattern 36 as a mask. Thereafter, ashing and cleaning are carried out to remove the gate resist pattern 36. In this way, a silicon oxide film 35A is formed, to which a gate pattern has been transferred.

Next, as shown in FIG. 12C, dry etching is performed on the polysilicon film 34 by a dry etching technique, using, as a mask, the silicon oxide film 35A to which the gate pattern has been transferred. FIG. 12C shows the state of the semiconductor device immediately after detection of an end point of etching.

In the dry etching of the polysilicon film 34 shown in FIG. 12C, the end point of etching is detected by the above-mentioned known end-point detection method using interference light. That is, the end point of etching is detected on the basis of a desired value of the thickness of the remaining polysilicon film 34. More particularly, the desired value of the thickness of the remaining film is 50 nm, the wavelength of the light is 600 nm, and the instant at which the waveform of the interference light reaches the second maximum is detected as the end point of etching. The reason why the maximum of the waveform of the interference light is used to detect the end point of etching is that human beings can easily judge whether the end point of etching is normally detected. Note that, as represented by the equations (1) through (3), the end point of etching can be detected without the use of the maximum or the minimum, and the wavelength of the light can be set at an arbitrary value.

However, according to the above-mentioned known end-point detection method used for gate formation, in dry etching of the polysilicon film 34, the waveform of the interference light obtained during the detection of an end point is not sinusoidal but forms, for example, a waveform as shown in FIG. 13. As a result, as shown in FIG. 12D, it becomes impossible to detect the end point, resulting in the damaged gate oxide film 33. More particularly, for example, through holes 37 are produced in the gate oxide film 33.

On the other hand, in the end-point detection method using interference light as disclosed in Japanese Unexamined Patent Publication No. 2001-85388, in order to cancel the influence of reflected light from the resist film serving as a mask, a dummy end point is detected using two kinds of reflected lights of different wavelengths. The two kinds of reflected lights have a relationship in which the phase differences of interference waveforms each having a short period is close to each other. To be specific, this method determines the intensity ratio between respective interference lights from the two kinds of reflected lights or a differential value of the intensity ratio. With this method, the phase difference between respective interference waveforms from the two kinds of reflected lights is determined on the basis of the intensity ratio between the two interference waveforms. Thus, detected as a dummy end point is the instant at which the intensity ratio (=phase difference) approaches a constant value or the instant at which the differential value of the intensity ratio (=phase difference) approaches 0. For example, as shown in FIG. 12C, the instant at which the polysilicon film 34 is slightly left is set as the dummy end point using a sample wafer in order to prevent the gate oxide film 33 from being overetched. Therefore, product wafers of different wafer structures (for example, mask layouts) have somewhat different interference waveforms as compared with the sample wafer due to the influence of the aperture ratio of the resist film, pattern dependence, or variations in dimensions in a lithography process. As a result, the thickness of the remaining polysilicon film to be etched cannot precisely be controlled. Hence, the end-point detection time at which the end point is detected varies depending on the wafer structures, resulting in the damaged gate oxide film. Furthermore, after the detection of the end point, the etching conditions are switched to high-selectivity conditions, and controllability over dimensions is degraded under high-selectivity conditions. Therefore, when the end-point detection time varies depending on the wafer structures, the gate length varies from one wafer to another.

SUMMARY OF THE INVENTION

In view of the above, an object of the present invention is to provide a method and apparatus for detecting an end point whereby the end point of processing can certainly be detected by interference light in processing a to-be-processed layer using plasma etching or the like, and thereby prevent damage or the like to a gate oxide film due to an end-point detection error.

In order to attain the above object, the present inventors analyzed the cause of the instability of the interference light waveform as shown in FIG. 13 and obtained the following findings. It is considered that, as shown in FIG. 14, an interference light produced during etching of a polysilicon film does not result from only a reflection 41 on the polysilicon film (Poly-Si) and a reflection 42 on a gate oxide film ($SiO_2$/Poly-Si interface, but from the combination of these reflections 41 and 42 with a reflection 43 on the surface of a silicon oxide film (tetra ethyl ortho silicate (TEOS)) serving as a mask, a reflection 44 on a TEOS/Poly-Si interface, and a reflection 45 on a $SiO_2$/silicon substrate (Si substrate) interface. In this relation, the present inventors paid attention to, in particular, the reflections brought by the TEOS and the Poly-Si both varying in thickness during etching.

More particularly, as shown in FIGS. 15A and 15B, the interference light formed during actual etching of a polysilicon film is considered to be a composite wave of an interference light 51 formed on the silicon oxide film ($SiO_2$ film) serving as a mask and an interference light 52 formed on the Poly-Si. FIG. 16 shows the respective waveforms of the interference lights 51 and 52. As shown in FIG. 16, while the waveform of the interference light 52 (Poly-Si/$SiO_2$/Si structure) is a sinusoidal wave, the waveform of the interference light 51 ($SiO_2$/Si structure) seemingly exhibits a monotone increasing function. However, in fact, the waveform of the interference light 51 is also a sinusoidal wave. The reason why the waveform of the interference light 51 looks like a monotone increasing function is that the etching amount of the silicon oxide film ($SiO_2$ film) serving as a mask is small.

Since the interference lights 51 and 52 are produced on the silicon oxide film (TEOS) serving as a mask and the polysilicon film (Poly-Si), respectively, a deviation $\Delta d$ as shown in FIG. 17 exists between light sources from which the interference lights 51 and 52 are produced. Thus, a phase difference $\delta$ is produced. This phase difference $\delta$ depends on the initial thickness $d_{01}$ of the silicon oxide film serving as a mask, the etching rate $R_1$ of the silicon oxide film, the initial thickness $d_{02}$ of the polysilicon film, the etching rate $R_2$ of the polysilicon film, and the etching time $t$ of the polysilicon film, and is represented by the following equation (4):

$$\delta = 2\pi \Delta d/\lambda = (2\pi/\lambda) \times \{d_{01} - (R_1 - R_2)t\} \quad (4)$$

Thus, the phase difference $\gamma$ between the interference lights 51 and 52 is represented by the following equation (5):

$$\gamma = k_1 - k_2 - \delta \quad (5)$$
$$= (2\pi/\lambda)[2n(d_{01} - d_{02}) - d_{01} - \{(R_1 - R_2)(2n-1)\}t]$$

wherein $k_1$ represents the phase difference of the interference light 51 and $k_2$ represents the phase difference of the interference light 52.

Accordingly, the composite waveform of the waveform of the interference light 51 and the waveform of the interference light 52 is as shown in FIG. 18. The present inventors found that the composite waveform shown in FIG. 18 generally coincides with the waveform of the interference light formed during actual etching of the polysilicon film. More particularly, they found that the interference light formed during actual etching of the polysilicon film is determined depending on interference of light on the surface of the silicon oxide film serving as a mask and interference of light on the surface of the polysilicon film. Furthermore, they found that the waveform of the interference light brought by the polysilicon film can be calculated by removing an interference component brought by the mask layer from the waveform of a measured interference light, and that the end point of etching can certainly be detected based on the calculated waveform of the interference light.

To be specific, the waveform of the interference light obtained during actual etching of the polysilicon film (end-point detection waveform) exhibits a waveform shown in FIG. 19A. This waveform is considered to be equivalent to the product of a sinusoidal wave shown in FIG. 19B and a linear function (monotone decreasing line) having a negative slope as shown in FIG. 19C. Hence, if the liner function (monotone decreasing line) having a negative slope as shown in FIG. 19C is created using the interference light obtained during actual etching of the polysilicon film and the ratio of the created linear function to the waveform of the obtained interference light is determined, the interference component brought by the mask layer can be removed. More particularly, the interference light brought by only the polysilicon film can be extracted.

Furthermore, in order to create a linear function having a negative slope from the obtained interference light, the present inventors conceived a method in which the end-point detection waveform is double-integrated over a predetermined wavelength range and predetermined time. This double integration is represented by the following equation (6):

$$\iint \sin \omega t \cdot d\omega \cdot dt = -K \cdot t \quad (6)$$

wherein $K$ represents a constant, $\omega$ represents an angular frequency, $t$ represents time, and for the sake of simplicity, it is assumed that the end-point detection waveform is a sinusoidal wave. As represented by the equation (6), a linear function having a negative slope can be created by integrating the end-point detection waveform over a certain wavelength range.

As can be seen from the above, only an interference light brought by a desired polysilicon part can be obtained by determining the ratio of the end-point detection waveform of a certain wavelength to the end-point detection waveform integrated over a certain wavelength range, as represented by the following equation (7):

(Interference light Brought by only Desired Polysilicon Part)=(End-Point Detection Waveform of Certain Wavelength)/(End-Point Detection Waveform Integrated over Certain Wavelength Range)  (7)

In the equation (7), its numerator represents the thickness of the remaining polysilicon film (or the amount of the removed polysilicon film), and its denominator represents a disturbance component at a mask. In this relation, if the wavelength of the numerator is short, a large number of local maxima and local minima would appear in the end-point detection waveform, leading to the possibility of an error in the detection of the end point. Therefore, the wavelength of the numerator is preferably 400 nm or more. If the wavelength range of the denominator is narrow, the number of wavelengths for integration would be small. Therefore, noise at each wavelength would not sufficiently be absorbed in the integrated waveform. This makes it impossible to ignore noises. Thus, the wavelength range of the denominator is preferably 100 nm or more.

The present invention is made based on the above-mentioned findings, and to be specific, a method for detecting an end point of the present invention is used in processing a to-be-processed layer using a mask layer formed on the to-be-processed layer and comprises the steps of: irradiating the mask layer and the to-be-processed layer with light to measure interference light formed of reflected lights from the mask layer and the reflected lights from the to-be-processed layer; removing an interference component brought by the mask layer from the waveform of the measured interference light to calculate the waveform of the interference light brought by the to-be-produced layer; and determining the thickness of the remaining to-be-processed layer on the basis of the calculated waveform of the interference light and comparing the determined thickness of the remaining to-be-processed layer to a desired thickness thereof, thereby detecting the end point of processing on the to-be-processed layer.

An apparatus for detecting an end point of the present invention is used in processing a to-be-processed layer using a mask layer formed on the to-be-processed layer and comprises: a light source for irradiating the mask layer and the to-be-processed layer with light; a spectroscope for measuring interference light formed of reflected lights from the mask layer and reflected lights from the to-be-processed layer under the light from the light source; arithmetic means for removing an interference component brought by the mask layer from the interference light measured by the spectroscope to calculate the waveform of the interference light brought by the to-be-produced layer; and end-point detection means for determining the thickness of the remaining to-be-processed layer based on the waveform of the interference light calculated by the arithmetic means and comparing the determined thickness of the remaining to-be-processed layer to a desired thickness thereof, thereby detecting the end point of processing on the to-be-processed layer.

According to the present invention, in the end-point detection in the processing of the to-be-processed layer using the mask layer formed on the to-be-processed layer, the interference component brought by the mask layer is removed from the interference light formed of reflected lights from the mask layer and reflected lights from the to-be-processed layer. Therefore, the waveform of the interference light brought by the to-be-processed layer can be calculated independently of the differences among wafer structures such as mask layouts. Thus, the end point of processing on the to-be-processed layer can certainly be detected based on the calculated waveform (end-point detection waveform). Accordingly, for example, in dry etching of a polysilicon film that will be a gate electrode, the gate oxide film can certainly be prevented from being damaged due to an end-point detection error.

DETAILED DESCRIPTION OF THE INVENTION

Embodiment 1

A method for detecting an end point according to a first embodiment of the present invention will be described hereinafter with reference to the drawings. In this embodiment, a description will be given of, as an example, dry etching of a polysilicon film in a process for forming a gate electrode. However, even when similar methods to that of this embodiment are applied to other dry etching processes in which the thickness of the remaining to-be-processed layer must precisely be controlled, similar effects to those of this embodiment can be expected.

FIGS. 1A through 1D are cross-sectional views showing process steps in a method for fabricating a semiconductor device using a method for detecting an end point according to the first embodiment.

Figure 1A:
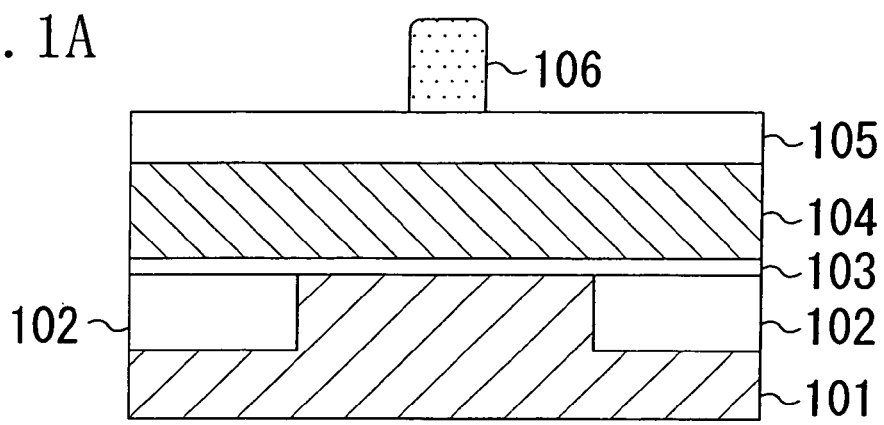
FIGS. 1A through 1D are cross-sectional views showing process steps in a method for fabricating a semiconductor device using a method for detecting an end point according to a first embodiment of the present invention.

First, as shown in FIG. 1A, a gate oxide film 103 is formed on a semiconductor substrate 101 formed with an isolation part 102, by a film forming method such as thermal oxidation. Then, a polysilicon film 104 and a silicon oxide film 105 are successively formed on the gate oxide film 103, by a film forming method such as Chemical Vapor Deposition (CVD). Thereafter, a resist pattern 106 having a desired gate pattern is formed on the silicon oxide film 105 using photolithography.

Figure 1B:
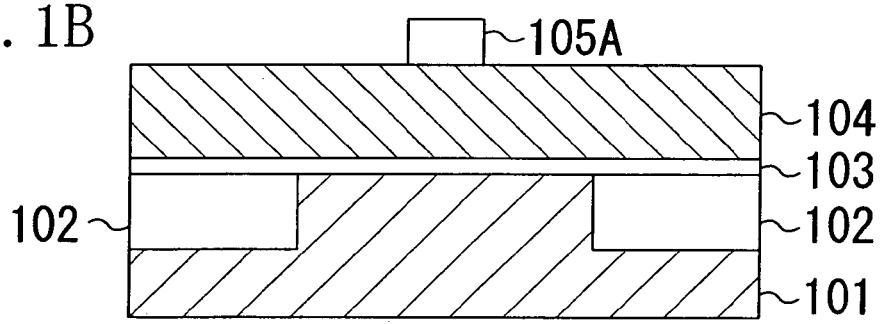

Next, as shown in FIG. 1B, dry etching is performed on the silicon oxide film 105 using the resist pattern 106 as a mask. Thereafter, ashing and cleaning are carried out to remove the resist pattern 106. In this way, a silicon oxide film 105A is formed to which a gate pattern has been transferred.

Figure 1C:
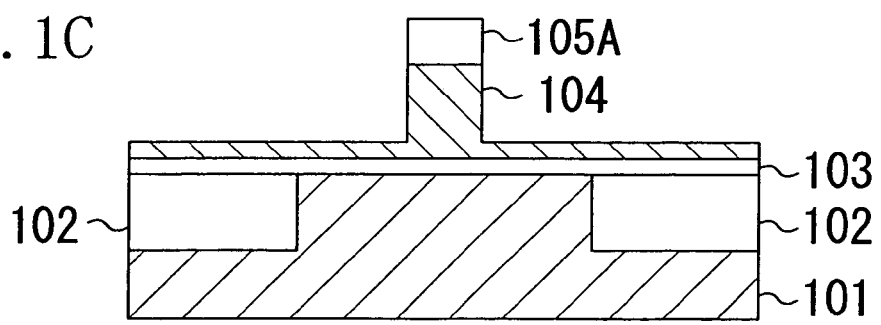

Next, as shown in FIG. 1C, dry etching is performed on the polysilicon film 104 using, as a mask, the silicon oxide film 105A to which the gate pattern has been transferred.

More particularly, dry etching is performed using, for example, induction coupled plasma (ICP) etching device under conditions of, for example, 350 W applied power for plasma generation, 100 W power applied to a sample stage, 0.4 Pa pressure, a $Cl_2$ flow rate of 20 ml/min, a HBr flow rate of 25 ml/min, a $CF_4$ flow rate of 25 mumin, and an $O_2$ flow rate of 3 ml/min.

Figure 2:
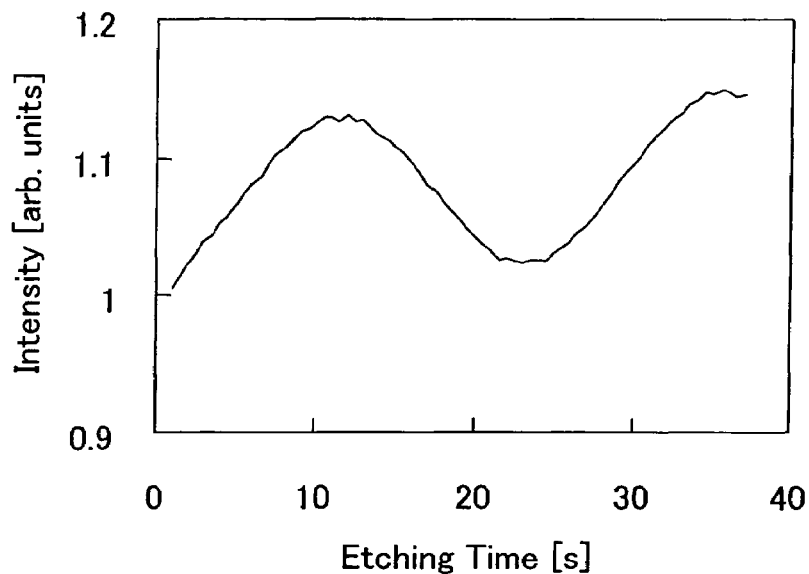
FIG. 2 is a graph showing the waveform of interference light brought by a polysilicon film, which is calculated by the method for detecting an end point according to the first embodiment of the present invention.

In this case, the method for detecting an end point of this embodiment in dry etching of the polysilicon film 104 is as follows. First, the silicon oxide film 105A serving as a mask layer and the polysilicon film 104 serving as a to-be-processed layer are irradiated with light to measure interference light formed of reflected lights from the silicon oxide film 105A and reflected lights from the polysilicon film 104. Subsequently, there is determined the ratio of the intensity of interference light (measured interference light) with a wavelength (specific wavelength) of, for example, 600 nm to the integral of the intensity of the measured interference light over a wavelength range, for example, from 400 nm to 800 nm. In this way, an interference component brought by the silicon oxide film 105A can be removed from the waveform of the measured interference light. Thus, the waveform of the interference light brought by the polysilicon film 104 can be calculated. FIG. 2 shows the waveform of the interference light thus calculated. Finally, the thickness of the remaining polysilicon film 104 is determined based on the calculated waveform of the interference light, and then the determined thickness of the remaining polysilicon film 104 is compared with a desired thickness thereof. In this way, an end point of processing on the polysilicon film 104 is detected.

In this embodiment, the polysilicon film 104 is slightly left even outside a gate electrode formation region where a gate electrode is to be formed to prevent the gate oxide film 103 from being damaged due to etching of the polysilicon film 104. In this case, the thickness of the polysilicon film 104 to be left can be set at an arbitrary value by changing the above-mentioned specific wavelength.

Figure 1D:
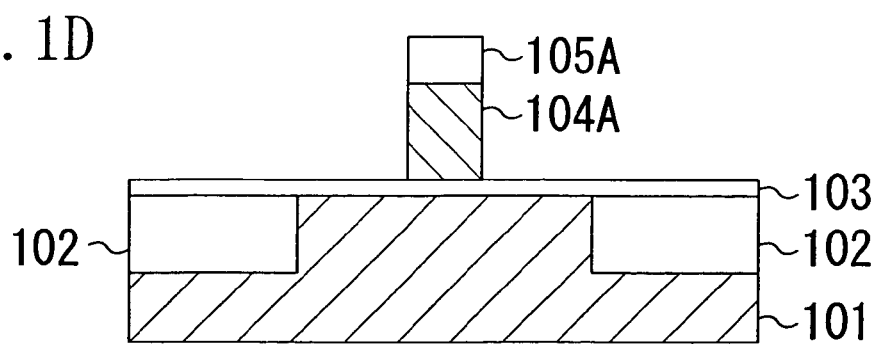

Next, as shown in FIG. 1D, the etching mode is switched from a low-selectivity mode to a high-selectivity mode to remove the polysilicon film 104 left outside the gate electrode formation region by etching. More particularly, dry etching is performed using an ICP etching device under conditions, for example, 250 W applied power for plasma generation, 50 W power applied to a sample stage, 10 Pa pressure, a HBr flow rate of 50 ml/min, an $O_2$ flow rate of 1 ml/min, and a He flow rate of 50 ml/min. In this case, even when the gate oxide film 103 serving as an underlying layer is exposed, a gate electrode 104A formed of a polysilicon film 104 can be formed with the gate oxide film 103 hardly damaged, because the etching rate of the gate oxide film 103 is extremely low.

As described above, according to the first embodiment, in the end-point detection during processing of a to-be-processed layer (polysilicon film 104) using a mask layer (silicon oxide film 105A) formed on the to-be-processed layer, an interference component brought by the mask layer can be removed from interference light formed of reflected lights from the mask layer and reflected lights from the to-be-processed layer. Therefore, the waveform of the interference light brought by the to-be-processed layer can be calculated independently of the differences among wafer structures such as mask layouts. Thus, the end point of processing on the to-be-processed layer can certainly be detected based on the calculated waveform (end-point detection waveform). In other words, in dry etching of the polysilicon film 104 that will be a gate electrode, the gate oxide film 103 can certainly be prevented from being damaged due to an end-point detection error.

According to the first embodiment, there is determined the ratio of the intensity of the measured interference light with a specific wavelength of 600 nm to the integral of the intensity of the measured interference light over a wavelength range from 400 nm to 800 nm. Accordingly, in the end-point detection of etching of the polysilicon film 104, the interference component brought by the silicon oxide film 105A serving as a mask layer can certainly be removed from the waveform of the measured interference light. Thus, the end-point detection can certainly be carried out.

In the first embodiment, in order to remove the interference component brought by the silicon oxide film 105A from the waveform of the measured interference light, the ratio of the intensity of the measured interference light for one kind of specific wavelength to the integral of the intensity of the measured interference light over a predetermined wavelength range is determined. However, the ratio of the intensity of the measured interference light for two or more kinds of specific wavelengths to the above integral may be determined instead. Alternatively, the ratio of the intensity of the measured interference light for at least one kind of specific wavelength to the sum of the intensities of the measured interference light for at least ten kinds of wavelengths within the predetermined wavelength range may be determined.

Although in this embodiment a wavelength range from 400 nm to 800 nm is used as the predetermined wavelength range over which the intensity of the measured interference light is integrated, the wavelength range that can be used as the predetermined wavelength range is not restrictive. Note that if the lower limit of the predetermined wavelength range is 400 nm or more, a large number of maxima and minima can be prevented from appearing in the calculated end-point detection waveform, leading to the prevention of a detection error in detecting an end point. Furthermore, if the predetermined wavelength range has a width of 100 nm or more, noises can sufficiently be absorbed in the integrated waveform. Furthermore, if the predetermined wavelength range includes a range from 400 nm to 800 nm, the interference component brought by the mask layer can more precisely be removed.

Although a wavelength of 600 nm is used as the specific wavelength in the first embodiment, the wavelength that can be utilized as the specific wavelength is not particularly restrictive. In this case, the specific wavelength is preferably within the predetermined wavelength range. This allows the interference component brought by the mask layer to be precisely removed. In addition, when the specific wavelength is any integral multiple of a desired value of the thickness of the remaining to-be-processed layer, a maximum or a minimum in the calculated end-point detection waveform can be detected as the end point of etching. More particularly, in the first embodiment, when the end point of processing (etching) on the to-be-processed layer (polysilicon film 104) is detected, the use of the maximum or the minimum in the calculated end-point detection waveform permits easy judgment on whether the end point of etching is normally detected.

In the first embodiment, the to-be-processed layer is the polysilicon film 104 that will be a gate electrode. However, it is not restrictive. The to-be-processed layer may be a semiconductor layer or a silicide layer formed on any one of a semiconductor substrate, a dielectric on the semiconductor substrate and an underlying layer on the semiconductor substrate.

In the first embodiment, the mask layer is the silicon oxide film 105A to which a gate pattern is transferred. However, it is not restrictive. The mask layer may be a photopolymer film or a dielectric having an arbitrary pattern.

In the first embodiment, the end point of etching on the polysilicon film 104 that is the to-be-processed layer is detected during etching of the polysilicon film 104. However, alternatively, the end point of etching may be detected during suspension of etching of the polysilicon film 104.

In the first embodiment, plasma etching is performed as a processing on the to-be-processed layer. However, types of processings on the to-be-processed layer are not particularly restrictive. For example, chemical mechanical polishing or the like may be performed.

Embodiment 2

An apparatus and method for detecting an end point according to a second embodiment of the present invention will be described hereinafter with reference to the drawings. In this embodiment, a description will be given of, as an example, dry etching of a polysilicon film in a process for forming a gate electrode. However, even when similar methods to that of this embodiment are applied to other dry etching processes in which the thickness of the remaining to-be-processed layer must precisely be controlled, similar effects to those of this embodiment can be expected.

Figure 3:
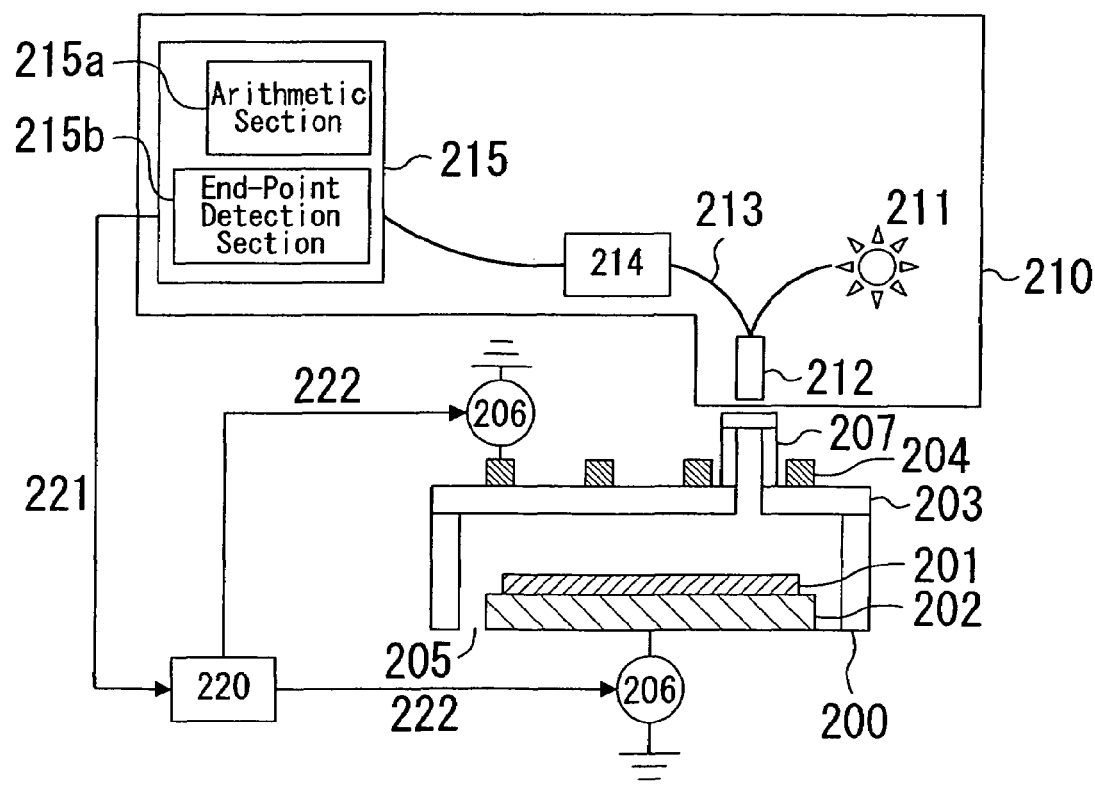
FIG. 3 is a diagram showing how an apparatus for detecting an end point according to a second embodiment of the present invention is used in combination with a dry etching device.

FIG. 3 is a diagram showing how an apparatus for detecting an end point according to the second embodiment is used in combination with a dry etching device.

A dry etching device shown in FIG. 3 comprises a process chamber 200, a lower electrode 202 positioned on the bottom of the process chamber 200 and serving as a sample stage on which a semiconductor substrate 201 is to be put, and a top plate 203 placed above and located a predetermined distance apart from the lower electrode 202. A coil 204 and a window member 207 are mounted on the top plate 203. The process chamber 200 is provided with a gas supply part (not shown) and a gas-emitting part 205 to which an evacuator (not shown) is connected. RF power sources 206 are connected via matching boxes (not shown) to the lower electrode 202 and a coil 204, respectively. Power is applied from the RF power sources 206 to the lower electrode 202 and the coil 204, thereby etching the semiconductor substrate 201.

An end-point detection apparatus 210 of this embodiment is used in processing a to-be-processed layer (not shown) using a mask layer formed on the to-be-processed layer on the semiconductor substrate 201. More particularly, the end-point detection apparatus 210 comprises a light source 211 for irradiating the mask layer and the to-be-processed layer with light, a spectroscope 214, an arithmetic section 215a, and an end-point detection section 215b. The spectroscope 214 measures interference light formed of reflected lights from the mask layer and reflected lights from the to-be-processed layer under the light from the light source 211. The arithmetic section 215a removes an interference component brought by the mask layer from the interference light measured by the spectroscope 214 to calculate the waveform of the interference light brought by the to-be-processed layer. The end-point detection section 215b determines the thickness of the remaining to-be-processed layer based on the waveform of the interference light calculated by the arithmetic section 215a and compares the thickness of the remaining to-be-processed layer to a desired thickness thereof, thereby detecting an end point of processing on the to-be-processed layer.

The arithmetic section 215a and the end-point detection section 215b are implemented, for example, on a computer 215. Furthermore, the end-point detection apparatus 210 comprises a light-receiving/emitting device 212 placed above the window member 207 of the dry etching device. The light-receiving/emitting device 212 irradiates the semiconductor substrate 201 with light from a light source 211 and collects lights reflected on the semiconductor substrate 201. The light source 211, the device 212 and the spectroscope 214 are connected each via an optical fiber 213 to the device 212, the spectroscope 214 and the computer 215, respectively. Furthermore, the computer 215 is connected to a control section 220 of the dry etching device. When an end-point detection signal 221 is transmitted from the computer 215 to the control section 220, the control section 220 transmits, to the RF power sources 206, signals 222 for stopping the application of power in order to complete etching.

A description will be given below of a case where a method for detecting an end point using the end-point detection apparatus 210 of this embodiment is applied to dry etching.

Figure 4:
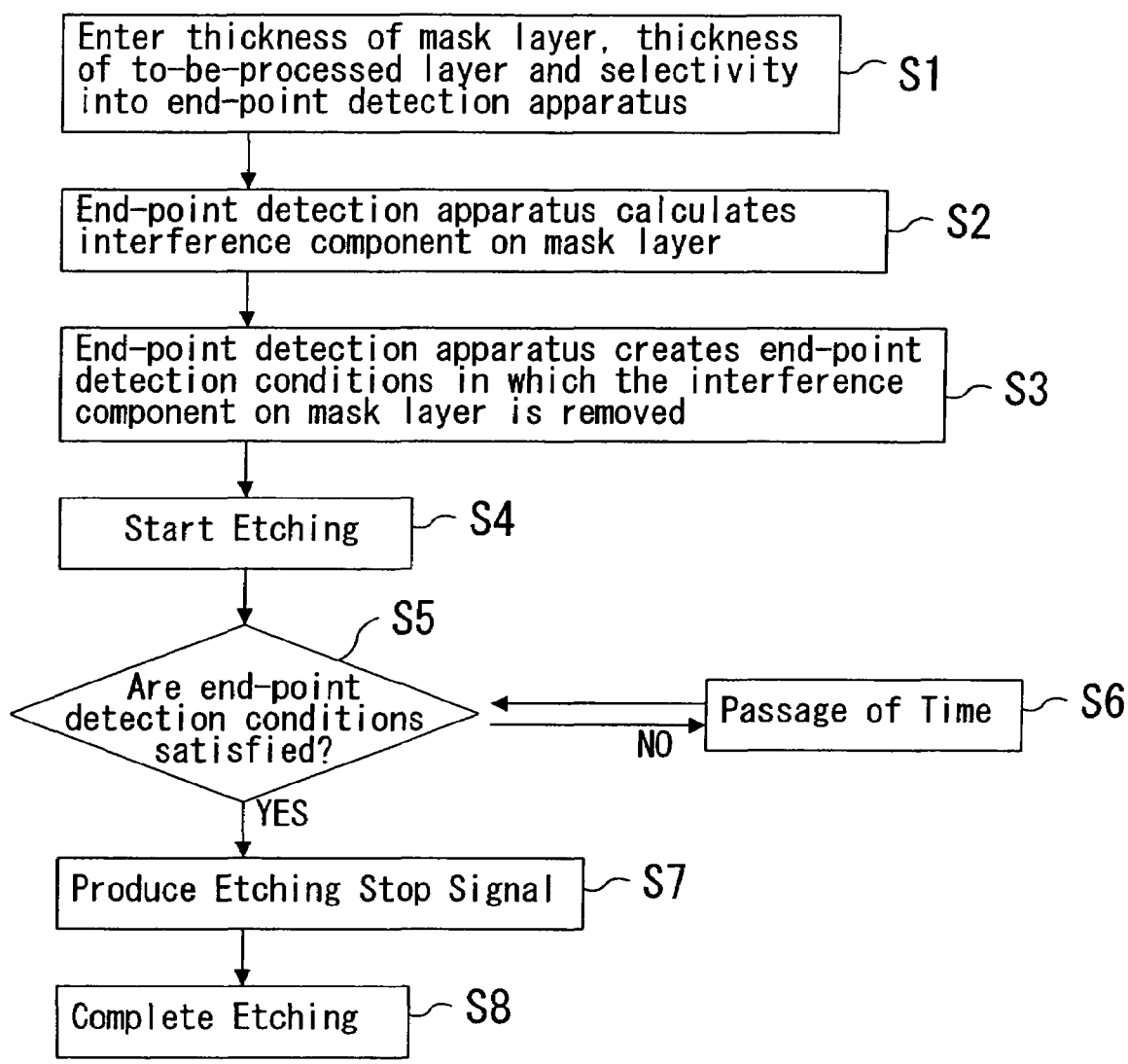
FIG. 4 is a flow chart showing a method for detecting an end point according to the second embodiment of the present invention.

FIG. 4 is a flow chart showing a method for detecting an end point of this embodiment.

First, in step S1, the initial thickness of the to-be-processed layer, the initial thickness of the mask layer, the etching rate of the to-be-processed layer, and the etching rate of the mask layer are previously entered into the end-point detection apparatus 210 (specifically, the computer 215). Both the etching rates are determined based on etching conditions. Thus, values obtained by previously making a measurement are entered as these etching rates into the apparatus 210. Alternatively, these etching rates may be entered as a selectivity into the apparatus 210.

In this case, by using the equations (1) through (3) (see "Description of Related Art"), the intensity of the interference light brought by the mask layer can be determined in the manner represented by the following equation (8):

$$\begin{aligned}\text{Intensity of Interference light} &= A^2 + B^2 + 2AB \times \cos(a-b) \quad (8)\\ &= A^2 + B^2 + 2AB \times \cos(2\pi n \times (2d_1/\lambda))\\ &= \frac{A^2 + B^2 + 2AB \times}{\cos(2\pi n \times (2(d_{01}-R_1 t)/\lambda))}\end{aligned}$$

wherein A and B represent the respective amplitudes of the reflected lights, a and b represent the respective initial phases of the reflected lights, n represents an integer, $d_1$ represents the thickness of the remaining mask layer, $d_{01}$ represents the initial thickness of the mask layer, $R_1$ represents the etching rate of the mask layer, t represents etching time, and λ represents the wavelength of the light.

By the way, as described in "SUMMARY OF THE INVENTION", since the interference light Φ brought by the mask layer and the interference light Θ brought by the to-be-produced layer are produced on the mask layer and the to-be-processed layer, respectively, a deviation exists between light sources from which the interference lights are produced. Therefore, a phase difference δ is produced due to the deviation. By using the equations (2) and (3) (see "Description of Related Art"), the phase difference $k_1$ of the interference light Φ and the phase difference $k_2$ of the interference light Θ are represented by the following equations (9) and (10), respectively.

$$k_1 = 2\pi n \times 2(d_{01} - R_1 t)/\lambda \quad (9)$$

$$k_2 = 2\pi n \times 2(d_{02} - R_2 t)/\lambda \quad (10)$$

Furthermore, the phase difference δ is represented by the following equation (11) like the equation (4) (see "SUMMARY OF THE INVENTION").

$$\delta = 2\pi \Delta d/\lambda = (2\pi/\lambda) \times \{d_{01} - (R_1 - R_2)t\} \quad (11)$$

Therefore, the phase difference γ between the interference lights Φ and Θ is represented by the following equation (12) like the equation (5) (see "SUMMARY OF THE INVENTION"):

$$\gamma = k_1 - k_2 - \delta \quad (12)$$
$$= (2\pi/\lambda)[2n(d_{01} - d_{02}) - d_{01} - \{(R_1 - R_2)(2n-1)\}t]$$

wherein n represents an integer, $d_1$ represents the thickness of the remaining mask layer, $d_{01}$ represents the initial thickness of the mask layer, $d_2$ represents the thickness of the remaining to-be-processed layer, $d_{02}$ represents the initial thickness of the to-be-processed layer, $R_1$ represents the etching rate of the mask layer, $R_2$ represents the etching rate of the to-be-processed layer, t represents etching time, and λ represents the wavelength of light.

Next, in step S2, the arithmetic section 215a of the end-point detection apparatus 210 calculates the waveform of the interference light brought by the mask layer by using the equations (12) and (8) in accordance with the following procedure.

When the time t is 0 ($t_0$), the intensity $I_0$ of the interference light brought by the mask layer can be represented by the following equation (13) based on the equation (8).

$$I_0 = A^2 + B^2 + 2AB \times \cos(2\pi n \times 2(d_{01} - R_1 t_0)/\lambda) \quad (13)$$

In this case, since the phase difference γ is not taken into account in the equation (13), the phase difference $y_0$ in the case of t=$t_0$ is determined by the following equation (14) using the equation (12).

$$\gamma_0 = (2\pi/\lambda)[2n(d_{01} - d_{02}) - d_{01} - \{(R_1 - R_2)(2n-1)\}t_0] \quad (14)$$

Figure 5A:
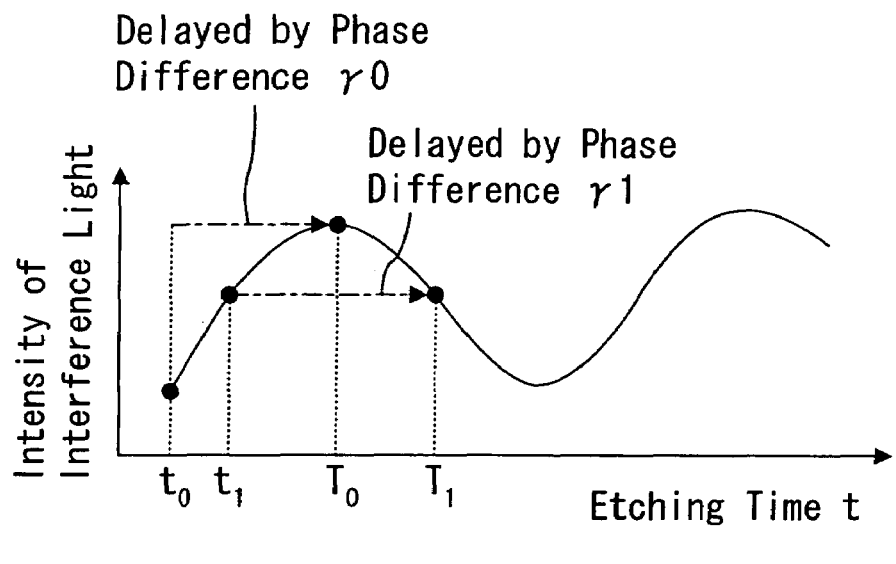
FIGS. 5A and 5B are graphs each showing the intensity of interference light brought by a mask layer, which is calculated by the method for detecting an end point according to the second embodiment of the present invention.

Accordingly, when the time t is 0 ($t_0$), the intensity of the interference light brought by the mask layer is the value lagging $\gamma_0$ behind the intensity $I_0$ calculated by the equation (13) as shown in FIG. 5A.

Figure 5B:
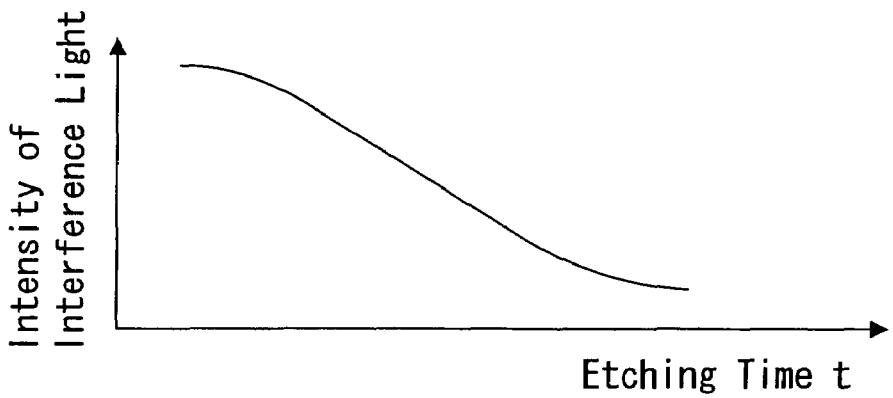

Subsequently, also when the time t is $t_1, t_2, \ldots,$ or $t_n$, the intensity of the interference light is likewise calculated, thereby calculating an interference component brought by the mask layer as shown in FIG. 5B.

Next, in step S3, the arithmetic section 215a of the end-point detection apparatus 210 creates the end-point detection conditions in which the interference component brought by the mask layer is removed from the interference light (for example, the intensity of the interference light on the to-be-processed layer corresponding to the desired thickness of the remaining to-be-processed layer).

Next, in step S4, an etching process is started for the to-be-processed layer on the semiconductor substrate 201 by using the dry etching device shown in FIG. 3.

Next, in step S5, the arithmetic section 215a of the end-point detection apparatus 210 removes the interference component brought by the mask layer and predicted as described above from the interference light measured by the spectroscope 214 (measured interference light). In this way, the waveform of the interference light brought by the to-be-processed layer can be calculated. Subsequently, the end-point detection section 215b of the end-point detection apparatus 210 determines the thickness of the remaining to-be-processed layer based on the calculated waveform of the interference light and compares the thickness of the remaining to-be-processed layer to a desired thickness thereof. In this way, it detects the end point of processing on the to-be-processed layer. More particularly, it judges whether the calculated waveform of the interference light satisfies the end-point detection conditions created in the step S4.

When in the step S5 it is judged that the end-point detection conditions are not satisfied, etching is further continued in step S6. When in the step S5 it is judged that the end-point detection conditions are satisfied, i.e., when the end point of processing on the to-be-processed layer is detected, an end-point detection signal 221 is transmitted from the computer 215 of the end-point detection apparatus 210 to the control section 220 in step S7. In this way, in step S8, the control section 220 transmits, to the RF power sources 206, signals 222 for stopping the application of power in order to complete etching. Thus, etching is completed.

As described above, according to the second embodiment, in the end-point detection during the processing of the to-be-processed layer using the mask layer formed on the to-be-processed layer, the interference component brought by the mask layer can be removed from the interference light formed of reflected lights from the mask layer and reflected lights from the to-be-processed layer. Therefore, the waveform of the interference light brought by the to-be-processed layer can be calculated independently of the differences among wafer structures such as mask layouts. Thus, the end point of processing on the to-be-processed layer can certainly be detected based on the calculated waveform (end-point detection waveform). Accordingly, in dry etching of the polysilicon film that will be a gate electrode, the gate oxide film can certainly be prevented from being damaged due to an end-point detection error.

According to the second embodiment, the interference component brought by the mask layer is predicted on the basis of the initial thickness of the mask layer, the initial thickness of the to-be-processed layer, the etching rate of the to-be-processed layer, and the etching rate of the mask layer. In addition, the predicted interference component is removed from the measured interference light. Therefore, the end-point detection can certainly be carried out.

In the second embodiment, the arithmetic section 215a of the end-point detection apparatus 210 predicts the interference component brought by the mask layer on the basis of the initial thickness of the mask layer, the initial thickness of the to-be-processed layer, the etching rate of the to-be-processed layer, and the etching rate of the mask layer. In addition, it removes the predicted interference component from the measured interference light. However, alternatively, the arithmetic section 215a may determine the ratio of the intensity of the measured interference light for at least one kind of specific wavelength to the sum of the intensities of the measured interference light for at least ten kinds of wavelengths within the predetermined wavelength range to remove the interference component brought by the mask layer from the measured interference light. Furthermore, alternatively, the arithmetic section 215a may determine the ratio of the intensity of the measured interference light for at least one kind of specific wavelength to the integral of the intensity of the measured interference light over a predetermined wavelength range to remove the interference component brought by the mask layer from the measured interference light.

In the second embodiment, the to-be-processed layer may be a semiconductor layer or a silicide layer formed on any one of a semiconductor substrate, a dielectric on the semiconductor substrate and an underlying layer on the semiconductor substrate.

In the second embodiment, the mask layer may be a photopolymer film or a dielectric having an arbitrary pattern.

In the second embodiment, the end point of etching on the to-be-processed layer may be detected during etching of the to-be-processed layer.

In the second embodiment, plasma etching is performed as a processing on the to-be-processed layer. However, types of processings on the to-be-processed layer are not particularly restrictive. For example, chemical mechanical polishing or the like may be performed.

Embodiment 3

A method for detecting an end point according to a third embodiment of the present invention will be described hereinafter with reference to the drawings.

Figure 6A:
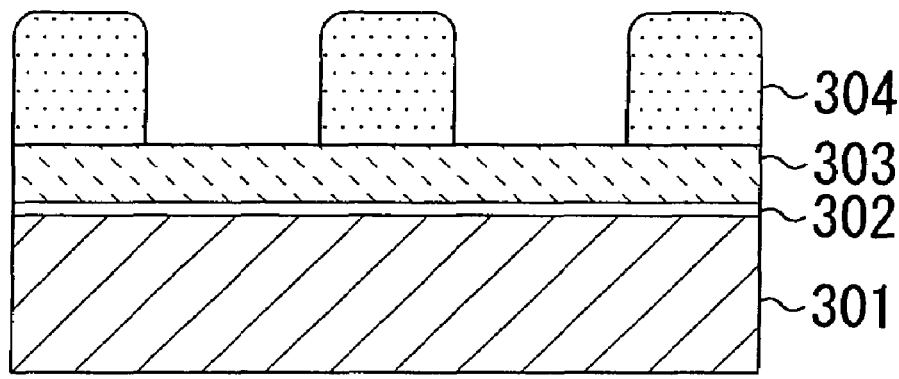
FIGS. 6A through 6C are cross-sectional views showing process steps in a method for fabricating a semiconductor device using a method for detecting an end point according to a third embodiment of the present invention.
Figure 6B:
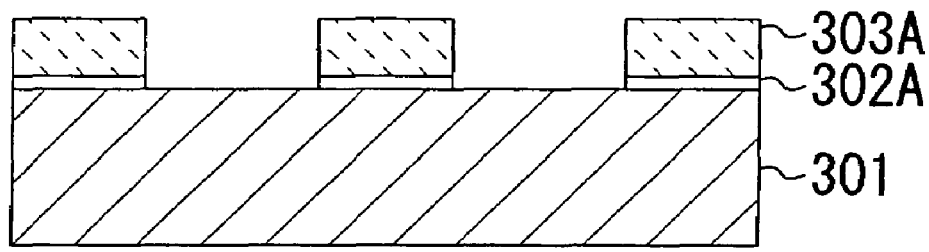
Figure 6C:
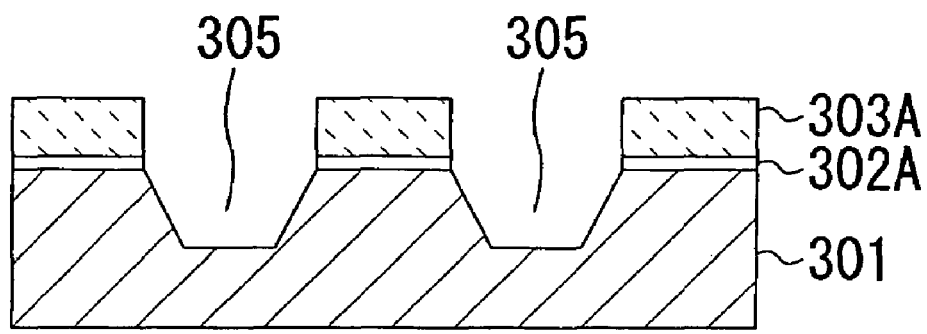

FIGS. 6A through 6C are cross-sectional views showing process steps in a method for fabricating a semiconductor device using the method for detecting an end point according to the third embodiment.

First, as shown in FIG. 6A, a silicon oxide film 302 is formed on a silicon substrate 301, for example, by thermal oxidation, and then a silicon nitride film 303 is formed on the silicon oxide film 302 by a film forming method such as CVD. Thereafter, a resist pattern 304 having a desired isolation pattern is formed using photolithography.

Next, as shown in FIG. 6B, dry etching is successively performed on the silicon nitride film 303 and the silicon oxide film 302 using the resist pattern 304 as a mask. Thereafter, ashing and cleaning are carried out to remove the resist pattern 304. In this way, a silicon nitride film 303A and silicon oxide film 302A are formed to which an isolation pattern has been transferred.

Next, as shown in FIG. 6C, dry etching is performed on the silicon substrate 301 using, as masks, the silicon nitride film 303A and silicon oxide film 302A to which the isolation pattern has been transferred. More particularly, dry etching is performed using, for example, an induction coupled plasma (ICP) etching device under conditions, for example, 600 W applied power for plasma generation, 500 W power applied to a sample stage, 7 Pa pressure, a $Cl_2$ flow rate of 150 ml/min, and an $O_2$ flow rate of 12 ml/min.

In this case, the method for detecting an end point of this embodiment in dry etching of the silicon substrate 301 is as follows. First, the silicon nitride film 303A serving as a mask layer and the silicon substrate 301 serving as a to-be-processed layer are irradiated with light to measure interference light formed of reflected lights from the silicon nitride film 303A and reflected lights from the silicon substrate 301. Subsequently, there is determined the ratio of the intensity of interference light (measured interference light) with a wavelength (specific wavelength) of, for example, 600 nm to the integral of the intensity of the measured interference light over a wavelength range, for example, from 400 nm to 800 nm. In this way, an interference component brought by the silicon nitride film 303A can be removed from the waveform of the measured interference light. Thus, the waveform of the interference light brought by the silicon substrate 301 (end-point detection waveform) can be calculated. Finally, the thickness of the remaining silicon substrate 301 (or the amount of the removed silicon substrate 301) is determined based on the calculated waveform of the interference light, and then the determined thickness of the remaining silicon substrate 301 (or the amount of the removed silicon substrate 301) is compared with a desired thickness thereof (or a desired amount of the removed silicon substrate 301). In this way, an end point of processing on the silicon substrate 301 is detected. In this case, the desired amount of the removed silicon substrate 301 can be set at an arbitrary value by changing the above-mentioned specific wavelength.

Finally, washing is performed to remove a deposition formed during dry etching of the silicon substrate 301. In this way, as shown in FIG. 6C, a trench 305 for isolation formation is formed in the silicon substrate 301.

In this relation, a description will be given of the relationship between the amount (depth) of the removed silicon substrate and interference light during etching of this embodiment with reference to FIGS. 7A and 7B.

Figure 7A:
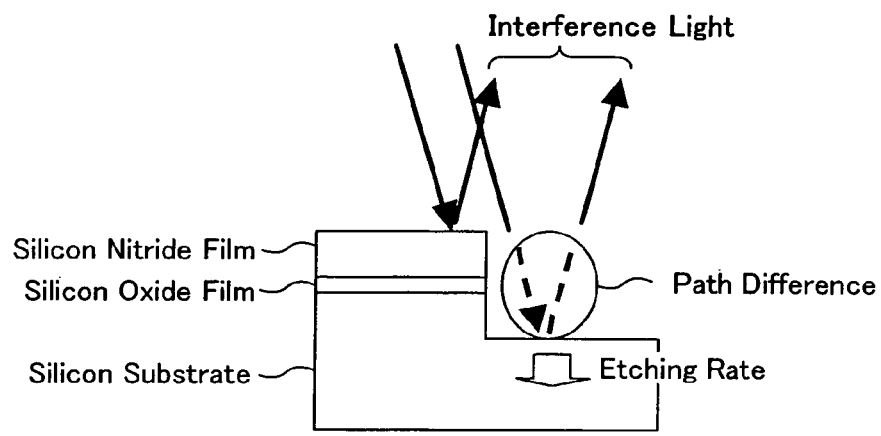
FIGS. 7A and 7B are a diagram and a graph showing the relationship between the amount (depth) of a removed silicon substrate and interference light during etching using the method for detecting an end point according to the third embodiment of the present invention, respectively.
Figure 7B:
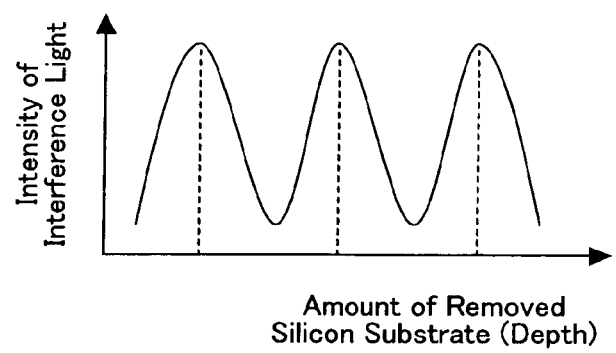

As shown in FIG. 7A, there is a path difference between the reflected light from the silicon nitride film and the reflected light from the surface of the silicon substrate. Therefore, when light from the light source is radiated vertically to the surface of the substrate, this path difference wholly constitutes a phase difference between the two reflected lights to produce interference light. In this case, as shown in FIG. 7B, when the phase difference is any integral multiple of the wavelength of the reflected light, the intensity of the interference light becomes strongest. On the other hand, when the phase difference is shifted a half wavelength from any integral multiple of the wavelength of the reflected light, the intensity of the interference light becomes weakest (see the equation (1) in "Description of Related Art"). More particularly, with the increase in the amount (depth) of the removed silicon substrate, the intensity of the interference light periodically varies.

In dry etching of the silicon substrate in the isolation formation process of this embodiment, the trench for forming the isolation is processed in a tapered form. Thus, there is employed the condition that the selectivity of the etching rate of the silicon substrate to the etching rate of the silicon nitride film (hereinafter, simply referred to as the selectivity) is relatively large (specifically, the condition that the selectivity is 100 or more). Therefore, it is considered that the interference light brought by the amount of the cut silicon nitride film can be ignored.

Figure 8:
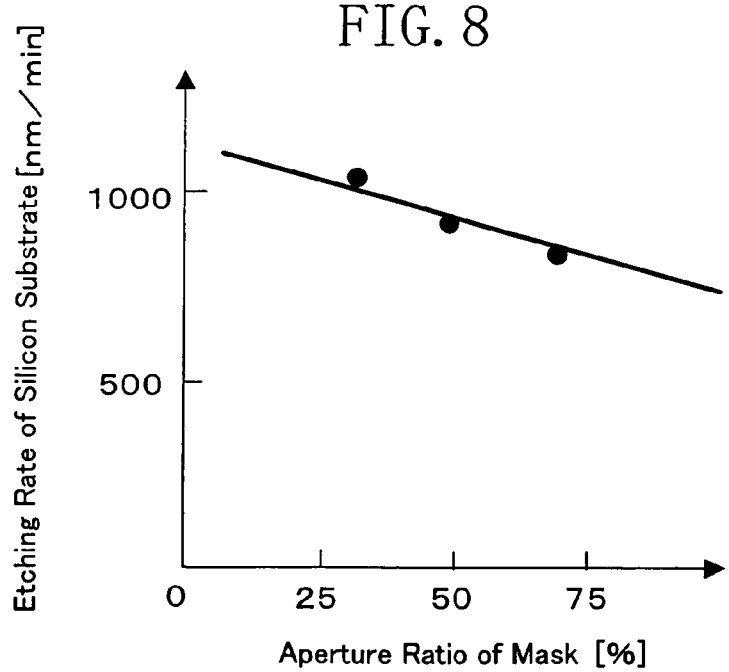
FIG. 8 is a graph showing the dependence of the etching rate of a silicon substrate on the aperture ratio of a mask.

By the way, the aperture ratio of a mask of the isolation pattern varies depending on semiconductor products. However, as shown in FIG. 8, in dry etching of a silicon substrate, the etching rate of the silicon substrate has a large dependence on the aperture ratio of the mask. The reason for this is that the amount of a reaction product during etching depends on the aperture ratio of the mask. Therefore, when etching time is fixed without executing the end-point detection in the dry etching of the silicon substrate, this exhibits a wide range of variations in the amount of the removed silicon substrate.

In contrast, according to the third embodiment, in the end-point detection during processing of a to-be-processed layer (silicon substrate 301) using a mask layer (silicon nitride film 303A) formed on the to-be-processed layer, an interference component brought by the mask layer can be removed from interference light formed of reflected lights from the mask layer and reflected lights from the to-be-processed layer. Therefore, the waveform of the interference light brought by the to-be-processed layer can be calculated independently of the differences among wafer structures such as mask layouts. Thus, an end point of processing on the to-be-processed layer can certainly be detected based on the calculated waveform (end-point detection waveform). In other words, in the isolation formation process for the silicon substrate 301, variations in the amount (depth) of the removed silicon substrate 301 can certainly be suppressed independently of the aperture ratio of the mask.

Figure 9A:
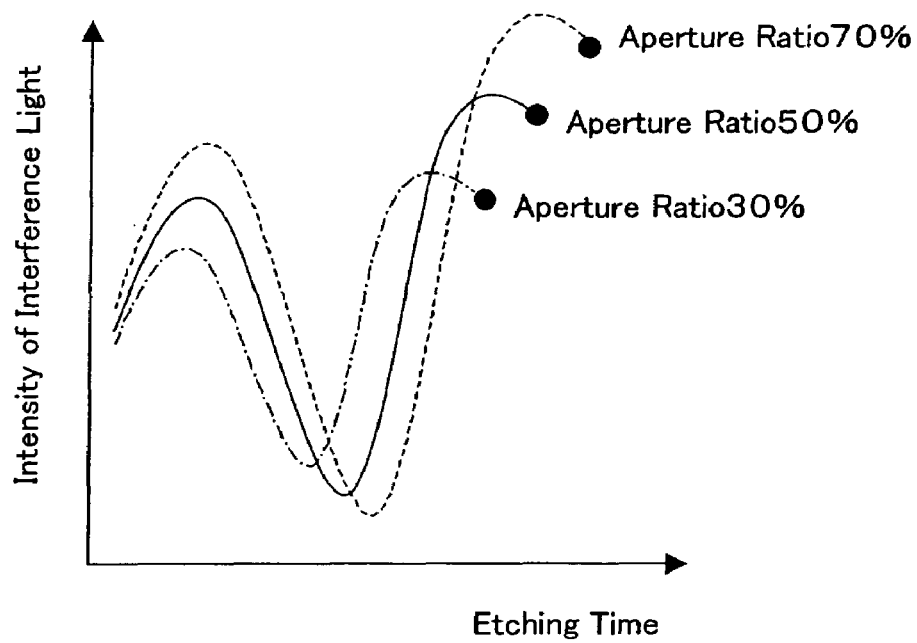
FIGS. 9A and 9B are a graph showing end-point detection waveforms at various mask aperture ratios and a graph showing the amounts (depths) of the removed silicon substrate at various mask aperture ratios, respectively, both under the use of the method for detecting an end point according to the third embodiment of the present invention.
Figure 9B:
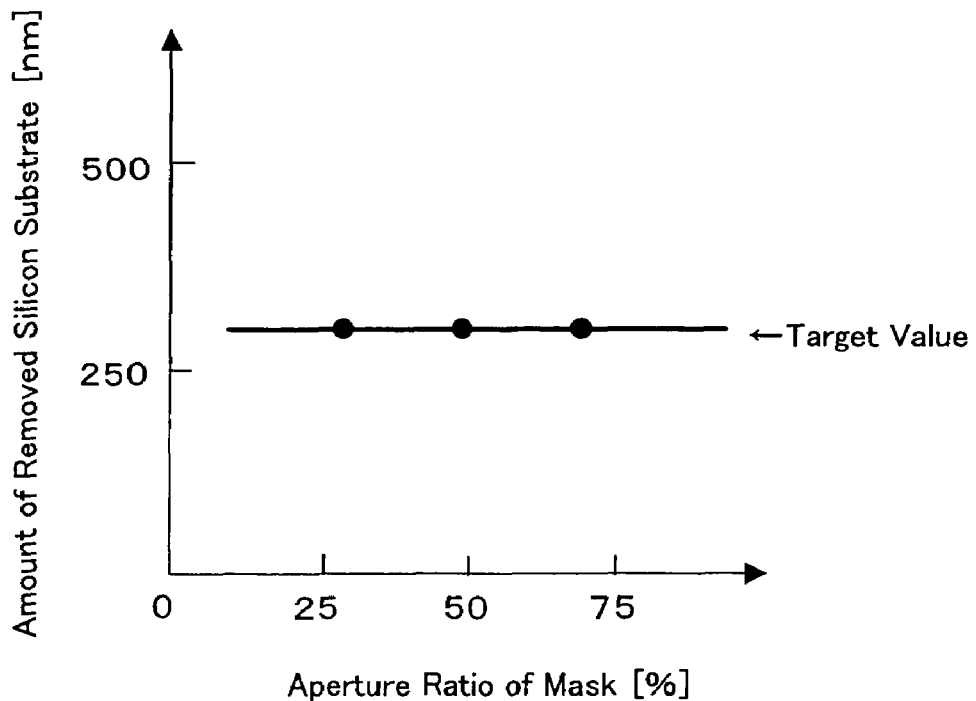
Figure 10:
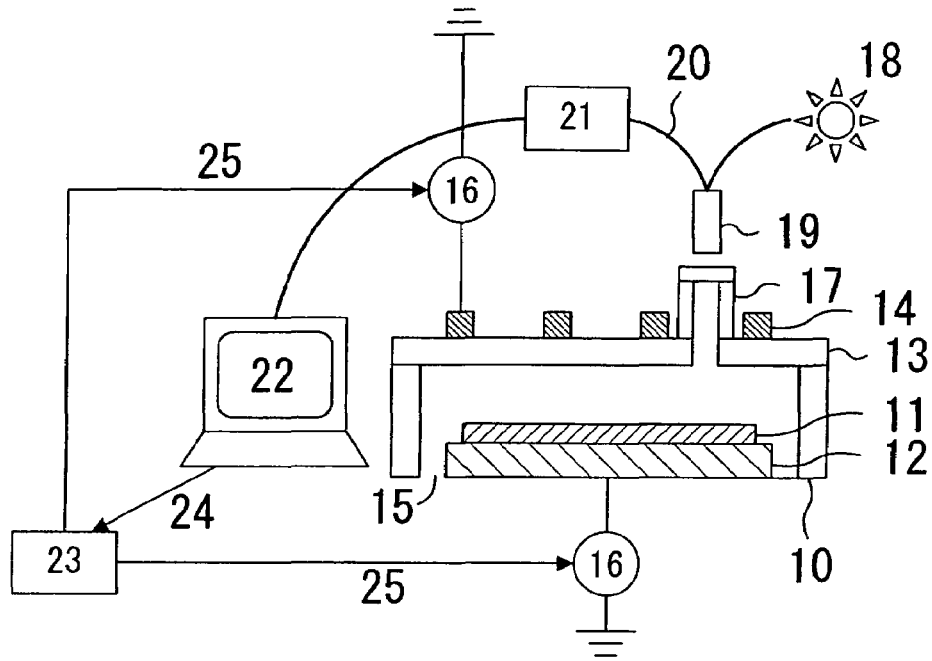
FIG. 10 is a diagram showing how a known apparatus for detecting an end point is used in combination with a dry etching device.
Figure 11A:
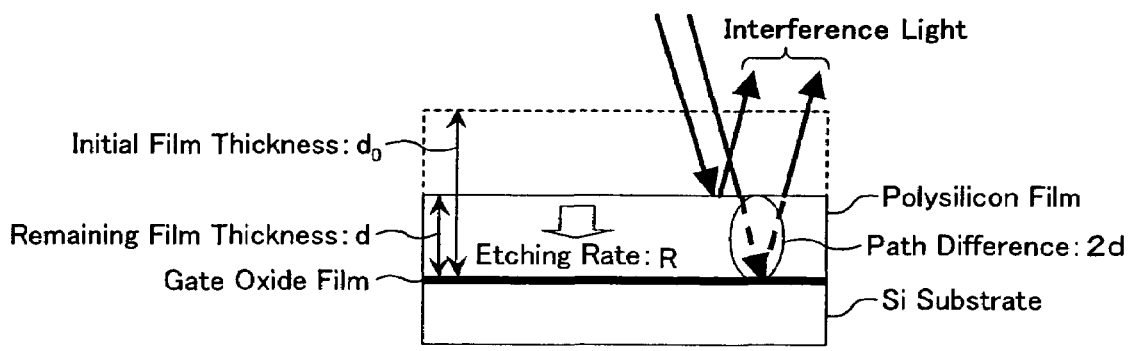
FIGS. 11A and 11B are a diagram and a graph both showing the relationship between the thickness of the remaining polysilicon film and interference light during etching using a known method for detecting an end point, respectively.
Figure 11B:
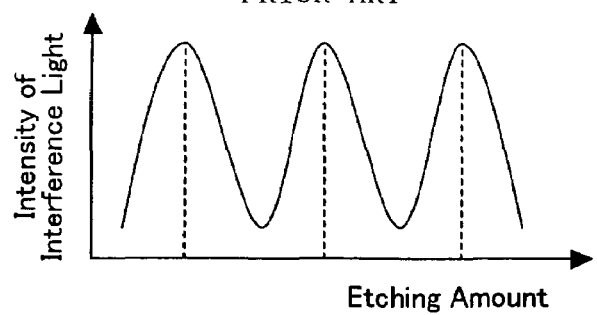
Figure 12A:
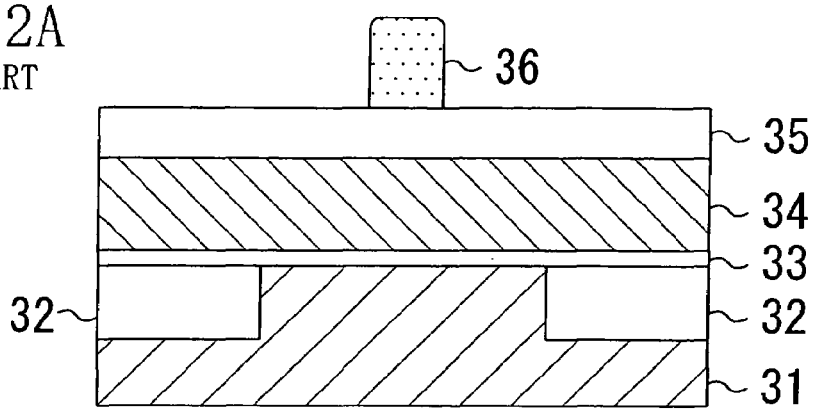
FIGS. 12A through 12C are cross-sectional views showing process steps in a method for fabricating a semiconductor device using the known method for detecting an end point.
Figure 12B:
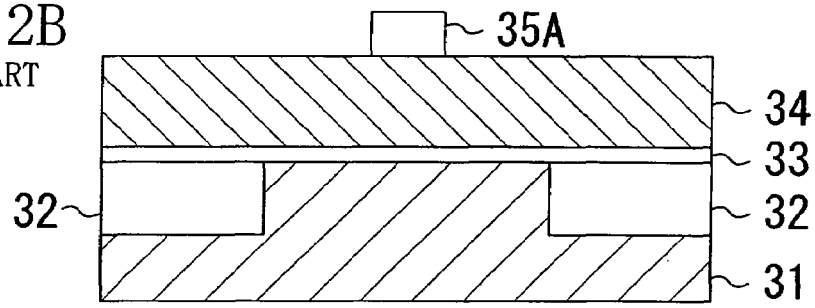
Figure 12C:
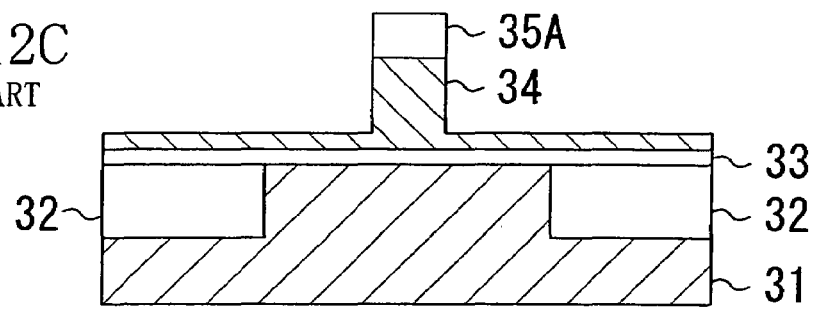
Figure 12D:
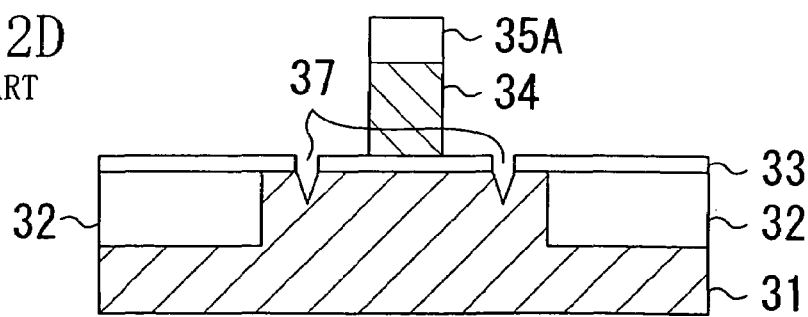
FIG. 12D is a cross-sectional view showing a problem of the known method for detecting an end point.
Figure 13:
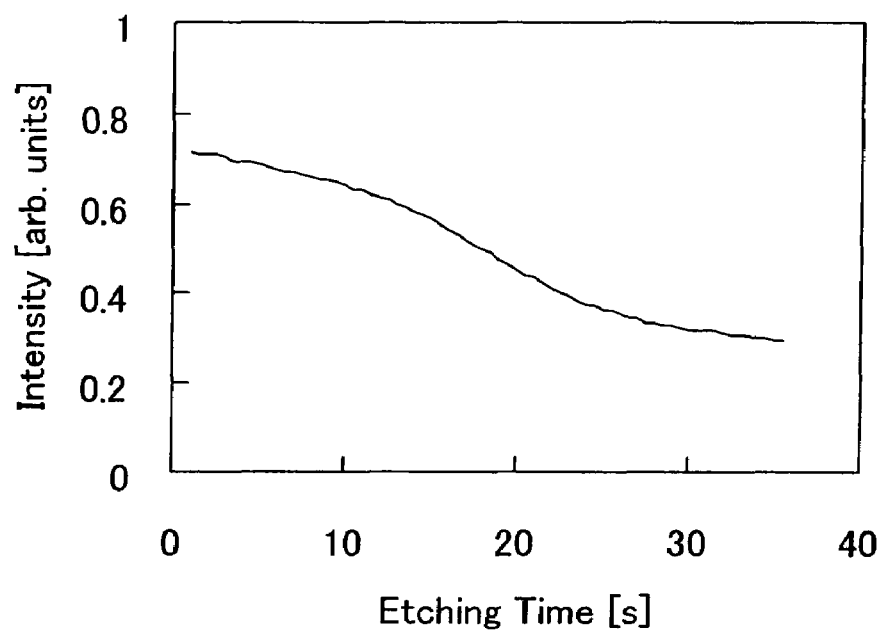
FIG. 13 is a graph showing the waveform of interference light obtained during detection of an end point in dry etching of the polysilicon film.
Figure 14:
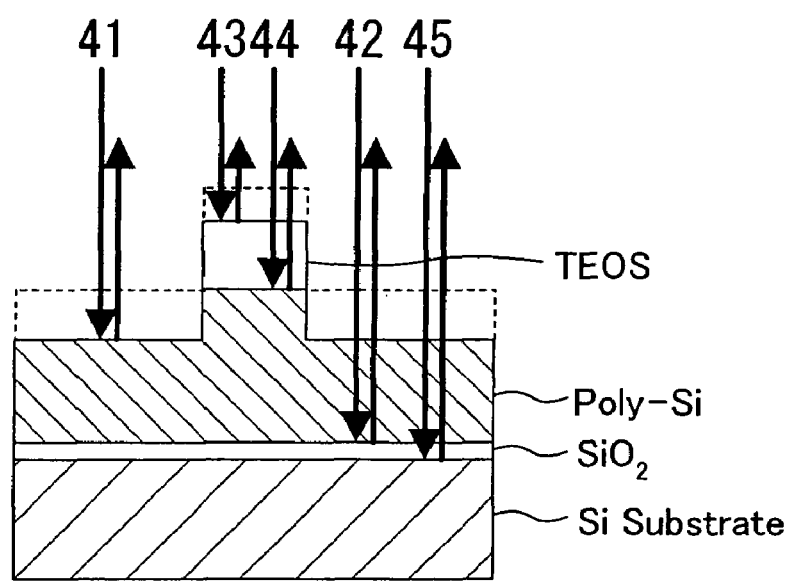
FIG. 14 is a diagram showing the reflections of lights during dry etching of the polysilicon film.
Figure 15A:
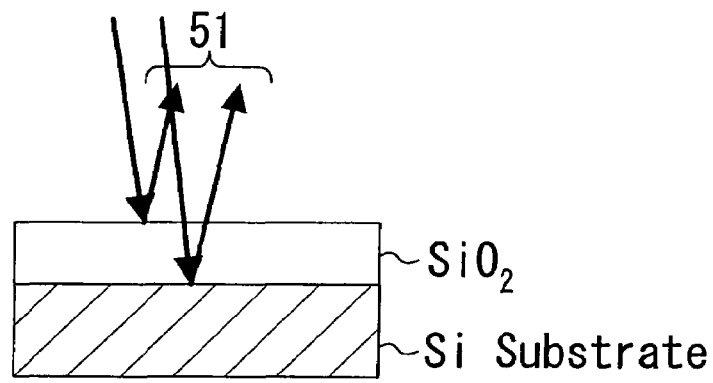
FIG. 15A is a diagram showing how interference light is formed on a silicon oxide film serving as a mask layer.
Figure 15B:
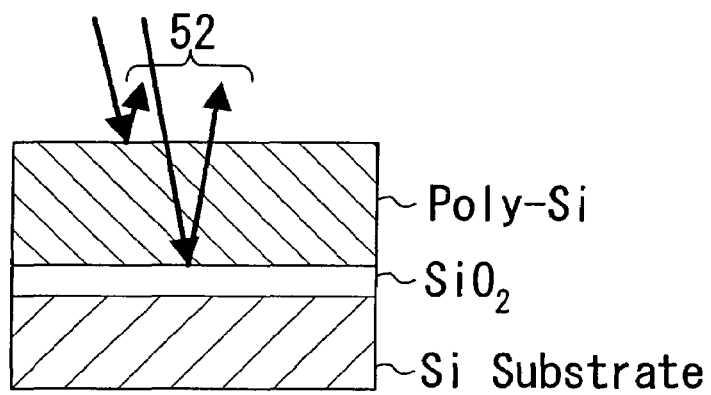
FIG. 15B is a diagram showing how interference light is formed on the polysilicon film serving as a to-be-processed layer.
Figure 16:
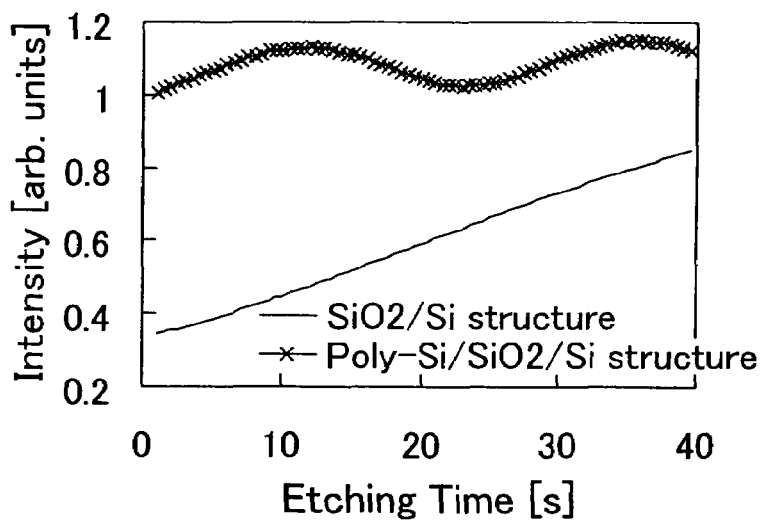
FIG. 16 is a graph showing the waveform of the interference light formed on the silicon oxide film serving as a mask layer and the waveform of the interference light formed on the polysilicon film serving as a to-be-processed layer.
Figure 17:
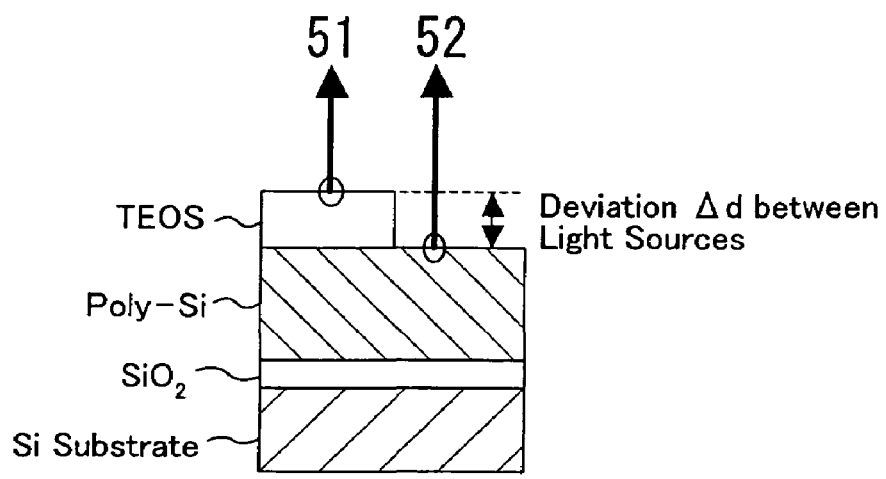
FIG. 17 is a diagram showing a deviation between the light source of the interference light formed on the silicon oxide film serving as a mask layer and the light source of the interference light formed on the polysilicon film serving as a to-be-processed layer.
Figure 18:
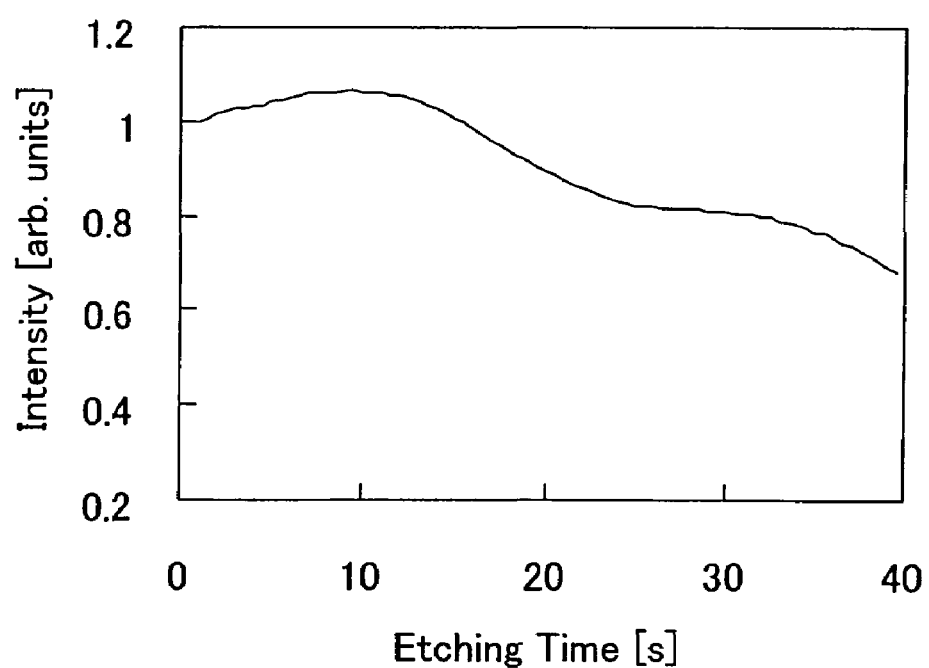
FIG. 18 is a graph showing a composite waveform between the waveform of the interference light formed on the silicon oxide film serving as a mask layer and the waveform of the interference light formed on the polysilicon film serving as a to-be-processed layer.
Figure 19A:
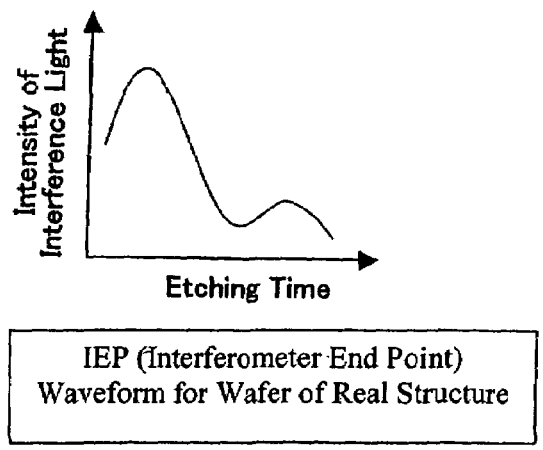
FIG. 19A is a graph showing the waveform of interference light obtained during actual etching of the polysilicon film.
Figure 19B:
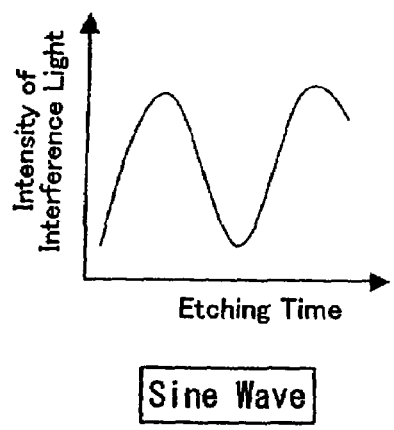
FIG. 19B is a graph showing the waveform of interference light represented by a sinusoidal wave.
Figure 19C:
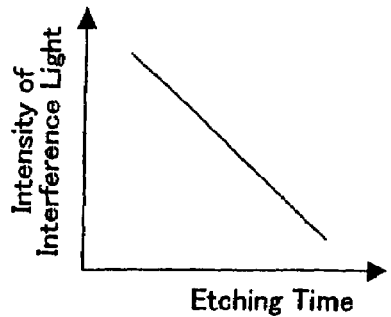
FIG. 19C is a graph showing the waveform of interference light represented by a linear function (monotone decreasing line) having a negative slope.

FIGS. 9A and 9B are a graph showing end-point detection waveforms at various mask aperture ratios and a graph showing the amounts (depths) of the removed silicon substrate at various mask aperture ratios, respectively, both under the use of the method for detecting an end point of this embodiment. More particularly, the use of the method for detecting an end point of this embodiment can provide a target amount (depth) of the removed silicon substrate independently of the mask aperture ratios as shown in FIG. 9B.

According to the third embodiment, there is determined the ratio of the intensity of the measured interference light with a specific wavelength of 600 nm to the integral of the intensity of the measured interference light over a wavelength range from 400 nm to 800 nm. Accordingly, in the end-point detection of etching of the silicon substrate 301, the interference component brought by the silicon nitride film 303A serving as a mask layer can certainly be removed from the waveform of the measured interference light. Thus, the end-point detection can certainly be carried out.

In the third embodiment, in order to remove the interference component brought by the silicon nitride film 303A from the waveform of the measured interference light, there is determined the ratio of the intensity of the measured interference light for one kind of specific wavelength to the integral of the intensity of the measured interference light over a predetermined wavelength range. Alternatively, the ratio of the intensity of the measured interference light for two or more kinds of specific wavelengths to the above integral may be determined. Furthermore, alternatively, the ratio of the intensity of the measured interference light for at least one kind of specific wavelength to the sum of the intensities of the measured interference light for at least ten kinds of wavelengths within the predetermined wavelength range may be determined.

Although in the third embodiment the wavelength range from 400 nm to 800 nm is used as the predetermined wavelength range over which the intensity of the measured interference light is integrated, the wavelength range that can be used as the predetermined wavelength range is not particularly restrictive. Note that if the lower limit of the predetermined wavelength range is 400 nm or more, a large number of maxima and minima can be prevented from appearing in the calculated end-point detection waveform, leading to the prevention of a detection error in detecting an end point. Furthermore, if the width of the predetermined wavelength range is 100 nm or more, noises can sufficiently be absorbed in the integrated waveform. Furthermore, if the predetermined wavelength range includes a range from 400 nm to 800 nm, the interference component brought by the mask layer can more precisely be removed.

Although in the third embodiment a wavelength of 600 nm is used as the specific wavelength, the wavelength that can be utilized as the specific wavelength is not particularly restrictive. In this case, the specific wavelength is preferably within the predetermined wavelength range. This allows the interference component brought by the mask layer to precisely be removed. In addition, when the specific wavelength is any integral multiple of a desired value of the thickness of the remaining to-be-processed layer, a maximum or minimum in the calculated end-point detection waveform can be detected as the end point of etching. More particularly, in the third embodiment, when the end point of processing (etching) on the to-be-processed layer (silicon substrate 301) is detected, the use of the maximum or minimum in the calculated end-point detection waveform permits easy judgment on whether the end point of the etching is normally detected.

In the third embodiment, the to-be-processed layer is the silicon substrate 301. However, it is not restrictive. The to-be-processed layer may be a semiconductor layer or a silicide layer formed on any one of a semiconductor substrate, a dielectric on the semiconductor substrate and an underlying layer on the semiconductor substrate.

In the third embodiment, the mask layer is the silicon nitride film 303A to which an isolation pattern is transferred. However, it is not restrictive. The mask layer may be a photopolymer film or a dielectric having an arbitrary pattern.

In the third embodiment, the end point of the etching on the silicon substrate 301 that is the to-be-processed layer is detected during etching of the silicon substrate 301. However, alternatively, the end point of the etching may be detected during suspension of the etching of the silicon substrate 301.

In the third embodiment, plasma etching is performed as a processing on the to-be-processed layer. However, types of processings on the to-be-processed layer are not particularly restrictive. For example, chemical mechanical polishing or the like may be performed.

What is claimed is:

1. An apparatus for detecting an end point used in processing a to-be-processed layer using a mask layer formed on the to-be-processed layer, said apparatus comprising;
   a light source for irradiating the mask layer and the to-be-processed layer with light;
   a spectroscope for measuring interference light formed of reflected lights from the mask layer and reflected lights from the to-be-processed later under the light from the light source;
   arithmetic means for removing an interference component brought by the mask later from the interference light measured by the spectroscope to calculate the waveform of the interference light brought by the to-be-produced later; and
   end-point detection means for determining the thickness of the remaining to-be-processed layer based on the waveform of the interference light calculated by the arithmetic means and comparing the determined thickness of the remaining to-be-processes layer to a desired thickness thereof, thereby detecting the end point of the processing on the to-be-processed layer,
   wherein the arithmetic means determines the ratio of the intensity of the measured interference light for at least one kind of specific wavelength to the sum of the intensities of the measured interference light for at least ten or more kinds of wavelengths to remove the interference component brought by the mask layer from the measured interference light.

2. An apparatus for detecting an end point used in processing a to-be-processed layer using a mask layer formed on the to-be-processed layer, said apparatus comprising;
   a light source for irradiating the mask layer and the to-be-processed layer with light;

a spectroscope for measuring interference light formed of reflected lights from the mask layer and reflected lights from the to-be-processed later under the light from the light source;

arithmetic means for removing an interference component brought by the mask later from the interference light measured by the spectroscope to calculate the waveform of the interference light brought by the to-be-produced later; and end-point detection means for determining the thickness of the remaining to-be-processed layer based on the waveform of the interference light calculated by the arithmetic means and comparing the determined thickness of the remaining to-be-processes layer to a desired thickness thereof, thereby detecting the end point of the processing on the to-be-processed layer, wherein the arithmetic means determines the ratio of the intensity of the measured interference light for at least one kind of specific wavelength to the integral of the intensity of the measured interference light over a predetermined wavelength range to remove the interference component brought by the mask layer from the measured interference light.

3. An apparatus for detecting an end point used in processing a to-be-processed layer using a mask layer formed on the to-be-processed layer, said apparatus comprising;

a light source for irradiating the mask layer and the to-be-processed layer with light;

a spectroscope for measuring interference light formed of reflected lights from the mask layer and reflected lights from the to-be-processed later under the light from the light source;

arithmetic means for removing an interference component brought by the mask later from the interference light measured by the spectroscope to calculate the waveform of the interference light brought by the to-be-produced later; and end-point detection means for determining the thickness of the remaining to-be-processed layer based on the waveform of the interference light calculated by the arithmetic means and comparing the determined thickness of the remaining to-be-processes layer to a desired thickness thereof, thereby detecting the end point of the processing on the to-be-processed layer, wherein the arithmetic means predicts the interference component brought by the mask layer on the basis of the initial thickness of the mask layer, the initial thickness of the to-be-processed layer, the etching rate of the to-be-processed layer, and the etching rate of the mask layer and removes the predicted interference component from the measured interference light.

* * * * *